United States Patent [19]

Casey, Jr. et al.

[11] 3,755,006

[45] Aug. 28, 1973

[54] DIFFUSED JUNCTION GAP ELECTROLUMINESCENT DEVICE

[75] Inventors: Horace Craig Casey, Jr., Summit; Lars Christian Luther, Basking Ridge, both of N.J.

[73] Assignee: Bell Telephone Laboratories Incorporated, Murray Hill, Berkeley Heights, N.J.

[22] Filed: Oct. 28, 1971

[21] Appl. No.: 193,606

[52] U.S. Cl. .................... 148/33, 148/186, 148/187, 148/189, 252/62.3 GA, 29/572, 317/235 R

[51] Int. Cl. .............................................. H01l 7/44

[58] Field of Search .................... 148/189, 186, 187, 148/191; 252/62.3 GA; 29/572; 317/235 N

[56] References Cited

UNITED STATES PATENTS

| | | | |
|---|---|---|---|
| 3,653,989 | 4/1972 | Widmer | 148/189 |
| 3,305,412 | 2/1967 | Pizzarello | 148/189 |
| 3,485,685 | 12/1969 | Casey et al. | 148/189 |
| 3,484,854 | 12/1969 | Wolley | 148/187 |

OTHER PUBLICATIONS

Shih et al., Journal of Applied Physics, Vol. 39, No. 6, May 1968, pp. 2,747–2,749.

Logan et al., Applied Physics Letters, Vol. 10, No. 7, April 1967, pp. 206–208.

Saul et al., Applied Physics Letters, Vol. 15, No. 7, October 1969, pp. 229–231.

*Primary Examiner*—G. T. Osaki
*Attorney*—W. L. Keefauver

[57] ABSTRACT p-n junctions for electroluminescent devices are produced in GaP and related semiconductors by diffusing zinc into an n-type wafer. The diffusion takes place in a sealed capsule with $ZnP_2$ as the zinc source. The $ZnP_2$ is included in the capsule in an amount which entirely evaporates during diffusion. When the n-type wafer also includes oxygen as a dopant, the emission of red light is enhanced by a subsequent heat treatment in a zinc-free atmosphere. In the absence of oxygen doping, green light is emitted.

7 Claims, 5 Drawing Figures

DIFFUSED JUNCTION GAP ELECTROLUMINESCENT DEVICE

BACKGROUND OF THE INVENTION

1. Field of the Invention p-n junctions are produced in gallium phosphide and related materials by a vapor phase diffusion process thus facilitating the use of integrated circuit techniques which permits control of the device geometry.

2. Description of the Prior Art

Gallium phosphide (GaP) electroluminescent diodes and diodes employing closely related materials are finding increased use in such devices as visual displays. The highest efficiency devices produced thus far in GaP have been produced by a double liquid phase epitaxial process. In such a process a layer of gallium phosphide of one conductivity type is grown from a gallium solution on a substrate of the same conductivity type forming a composite substrate for the subsequent growth from solution of a second layer of the opposite conductivity type. Red emitting diodes with the efficiencies on the order of 6 percent and green emitting diodes with efficiencies of approximately an order of magnitude lower have been produced by this process. The production of p-n junctions by such an epitaxial technique however, is not compatible with many of the integrated circuit techniques for geometry control that have proven so useful in the manufacture of other classes of solid state devices.

The production of p-n junctions by the diffusion of impurities into a wafer is more compatible with the usual masking and heat treatment techniques common to integrated circuit technology. The most successful attempts in this direction have utilized the diffusion of the acceptor, zinc, into an n-type gallium phosphide water. The most common donor dopant has been tellurium. Diodes designed for the emission of red light have also included oxygen as a dopant in the wafer (Gershenzon et al., *Physical Review*, 149, 580 [1966]; Nygren et al. *Journal of the Electrochemical Society-Solid State Science*, 116, 648 [1969]). For the emission of green light some workers in the field have used nitrogen as an additional dopant in place of oxygen, referred to above, (Epstein, Solid State Electronic, 12, 485, [1969]). The best efficiencies heretofore reported for diffused junction devices have been of the order of 0.6 percent in the red and of the order 0.01 percent in the green (Toyama et al., *Japanese Journal of Applied Physics*, 9, 468 [1970]). The production of the highest efficient devices possible is highly desirable for economic commercial usages.

The workers referred to above and other workers in the field have used various mixtures and compounds of zinc, phosphorus and gallium as sources of zinc in their vapor phase diffusion processes. A significant difficulty encountered in the earlier work was spacial nonuniformity and lack of reproducibility of the zinc diffusion which produced irregular junctions. Recently it has been learned that an overpressure of phosphorous in the diffusion atmosphere reduces this nonuniformity and produces more planar junctions. However, the problem of higher efficiency is still the subject of extensive development.

SUMMARY OF THE INVENTION

Diffused junction gallium phosphide diodes with efficiencies twice as high as previously reported have been produced using a fully evaporating quantity of $ZnP_2$ as the zinc source, the diffusion being carried out in a sealed capsule. Inclusion in the capsule of between 8 percent and 40 percent of that amount of $ZnP_2$ which will just produce a saturated $ZnP_2$ vapor in the capsule at the diffusion temperature produces surface concentration of the zinc dopant which are generally useful for presently contemplated electroluminescent devices. Exemplary light emitting diodes produced by vapor phase diffusion of zinc using such a zinc source have produced red emitting diodes with efficiencies generally between 0.8 and 1.5 percent with a majority of devices in the 1 to 1.2 percent range. This is a significant increase in efficiency and makes the devices suitable for a much greater range of usages. These devices were produced by diffusion into tellurium and oxygen doped epitaxial layers grown on tellurium doped substrate. These higher efficiencies of red emission were realized after heat treatment of the devices in a zinc free atmosphere subsequent to the diffusion step. While exemplary devices were fabricated using GaP, the invention is similarly operative in closely related semiconductor compounds in which GaP is the major constituent.

DETAILED DESCRIPTION OF THE INVENTION

The DIFFUSION PROCESS

The vapor phase diffusion process, which is the subject of this disclosure involves the introduction into a sealed diffusion chamber of a quantity of the compound $ZnP_2$, which is not sufficient to produce a saturated vapor at the diffusion temperature. If this condition is met, the $ZnP_2$ originally introduced is completely evaporated when the temperature is raised to the diffusion temperature. This evaporation may not be instantaneous, but the time required is much less than the time during which diffusion is allowed to proceed. In typical systems less than 1 liter in volume, the evaporation and initial equilibration is accomplished within five minutes.

Figure 1:
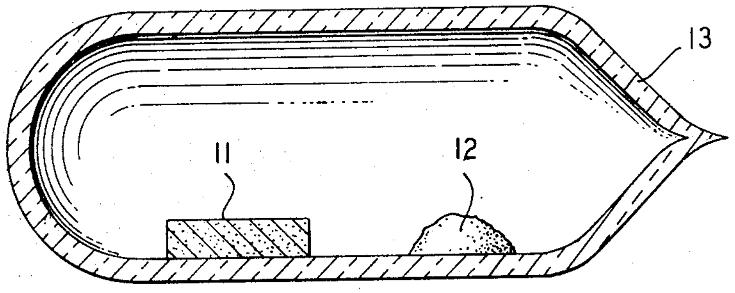
FIG. 1 is an elevational view in section of a sealed diffusion ampoule shown prior to elevation to the diffusion temperature.

In FIG. 1 an n-type gallium phosphide wafer 11 and a charge 12 of $ZnP_2$ are situated in a sealed ampoule 13. This exemplary diffusion chamber has been prepared for the diffusion process by being sealed under vacuum. In some instances the inclusion of a small quantity of some particular gas may be advantageous. For instance, if the emission of red light is to be suppressed, a small amount of a gas such as hydrogen will combine with oxygen in the system and tend to reduce oxygen contamination of the device.

Figure 2:
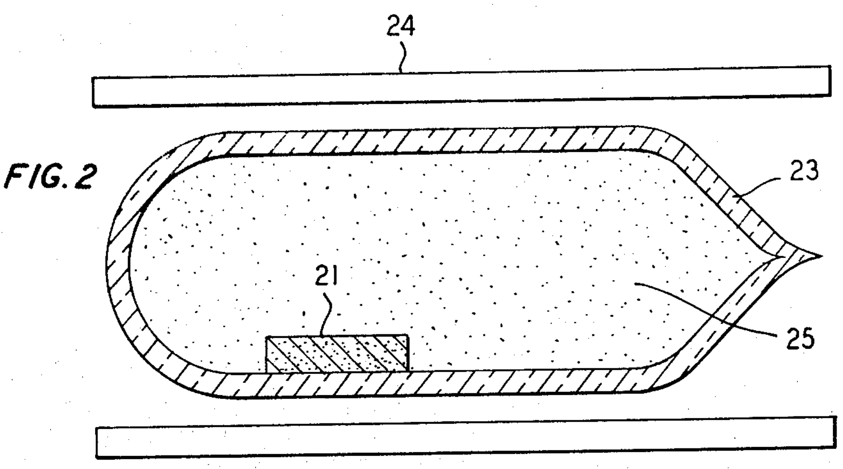
FIG. 2 is an elevational view in section of an exemplary diffusion apparatus including an ampoule raised to the diffusion temperature.

In FIG. 2, the ampoule 23 and its contents have been placed within an oven or other suitable heater 24 and the temperature of the ampoule 23 raised to the diffusion temperature. This increase of temperature has caused the $ZnP_2$ charge 12 to completely evaporate and be present now as a vapor 24. To the extent that the vapor is a vapor of the constituent species of the compound $ZnP_2$, the $ZnP_2$ can be replaced by elemental zinc and phosphorus. Inclusion in that form is, however, not as convenient as inclusion as the compound. As diffusion is allowed to proceed, zinc from the vapor diffuses into n-type gallium phosphide wafer. Since zinc is an acceptor species in gallium phosphide, as diffusion is allowed to proceed a p-n junction forms within the gallium phosphide wafer. The concentration of zinc atoms in the vapor and the temperature of the diffusion chamber determines the zinc concentration which is established at the gallium phosphide surface.

As time progresses, the zinc diffuses into the gallium phosphide and the p-n junction progresses deeper into the wafer 21 approximately as the square root of time. Since p-n junction formation depends upon compensation of the donor species present in the wafer the rate at which the junction progresses depends upon the amount of zinc available at the wafer surface. At constant temperature and time the junction depth is found to vary approximately linearly with the amount of $ZnP_2$ included. Times greater than 15 minutes are usually required to produce a junction far enough below the surface to be useful, while times greater than 24 hours are rarely practical for such a fabrication step. The choice of time, of course, also depends on the diffusion temperature, since diffusion proceeds more rapidly at higher temperature. For the materials under consideration diffusion is usually limited to the temperature range 600° to 1,200° C. Lower temperature require impractically long diffusion times while higher temperatures may result in deterioration of the wafer being diffused.

Figure 3:
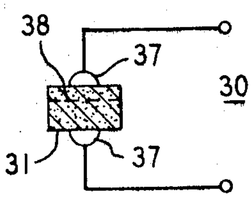
FIG. 3 is an elevational view in section of an exemplary diffused junction, electroluminescent diode.

FIG. 3 shows an exemplary p-n junction diode 30 which includes a portion 31 of a diffused wafer and electrical contacts 37 on either side of the p-n junction 38.

Figure 4:
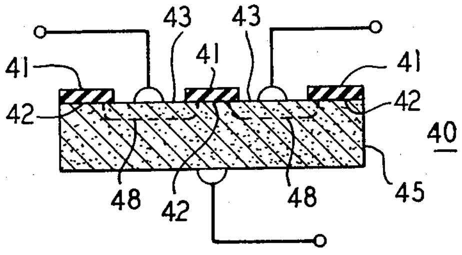
FIG. 4 is an elevational view in section of an exemplary diffused junction electroluminescent device including a masked areas where no diffused junction has been formed.

FIG. 4 also shows a diffused junction device 40. However, during diffusion, portions 42 of the surface of the wafer 45 from which the device was made, were masked by some suitable masking material 41. This mask 41 prevented zinc diffusion into those parts of the wafer surface 42 so that the p-n junctions 48 formed by the diffusion were formed only under the exposed portions 43 of the surface. Electrical contact to each of the exposed portions 42 is shown. This combination of masking and diffusion steps is common to integrated circuit technology and illustrates the utility of the disclosed process in this connection.

Figure 5:
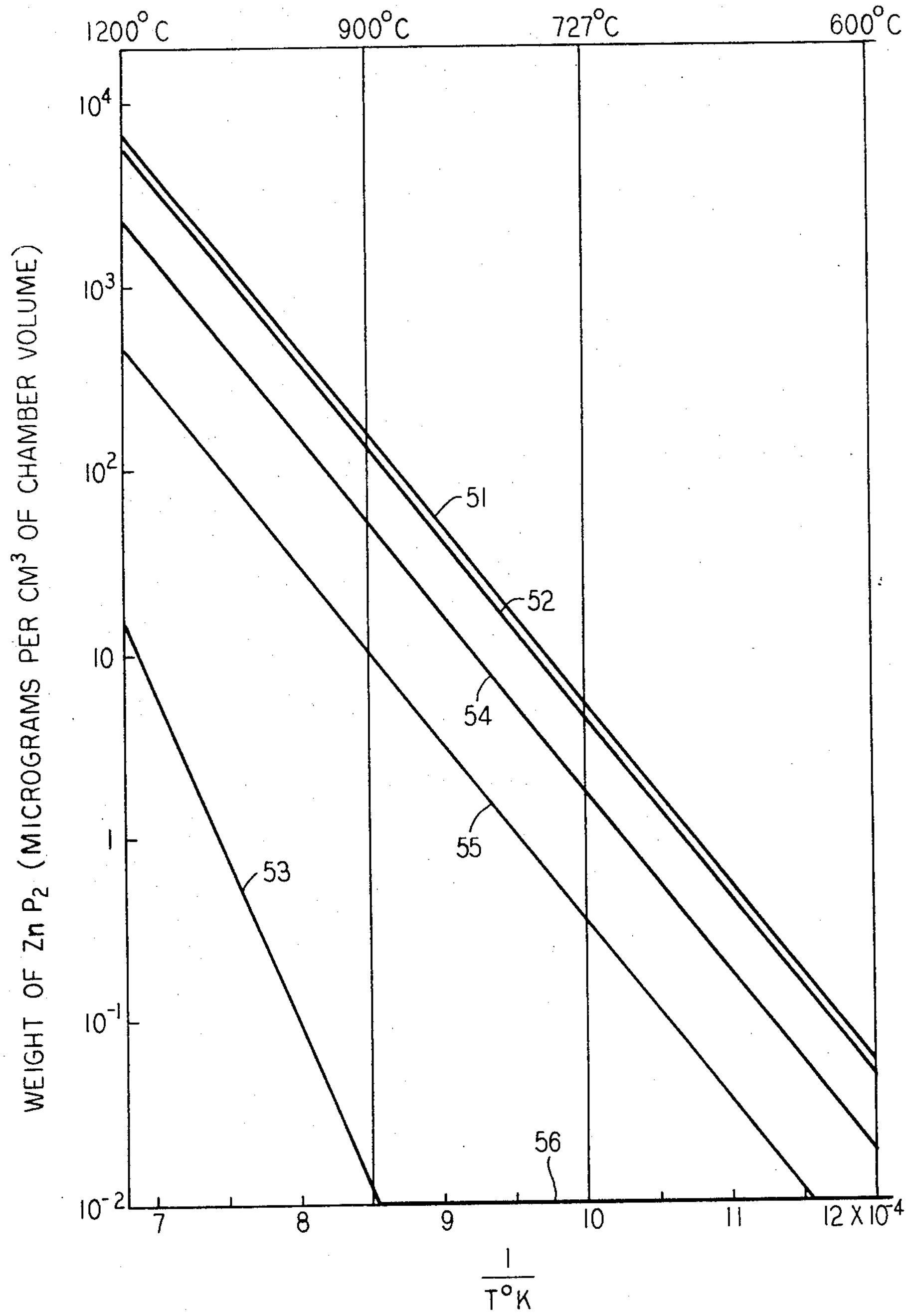
FIG. 5 is a graph of the quantity of $ZnP_2$ (ordinate) as a function of the reciprocal of the diffusion temperature (abscissa) illustrating the preferred ranges which fall within the invention.

Various quantative aspects of the invention are illustrated in FIG. 5. On the ordinate of this graph (FIG. 5) is plotted the number of micrograms of $ZnP_2$ included in the diffusion chamber for every cubic centimeter of diffusion chamber volume. If the gallium phosphide and support members included in the chamber occupies a significant volume, that volume must be subtracted from the chaber volume when calculating the amount of $ZnP_2$ to be included in the chamber. On the abscissa is plotted the reciprocal of the diffusion temperature measured on the Kelvin scale. The corresponding centigrade temperature is indicated at the upper margin. Curve 51 represents an experimental determination of that quantity of $ZnP_2$ which is just sufficient to provide a saturated atmosphere within the diffusion chamber at the diffusion temperature. That is to say, for every particular diffusion temperature a quantity of $ZnP_2$ falling below this line 51 will be completely evaporated during at least a major portion of the diffusion time while amounts represented above the line 51 will not be completely evaporated and an unevaporated portion of the $ZnP_2$ charge will remain during diffusion.

In contrast to the concurrent work of others (A. E. Widmer et al., *Solid State Electronics*, 14, 423 [1971]) it has been found advantageous to carry out the diffusion process using quantities of $ZnP_2$ represented by points below curve 51. Light emitting diodes of higher efficiency have been obtained in this regime as shown by parallel experiments. A possible explanation suggested for this advantage lies in the presence of a lower zinc surface concentration due to a lower zinc concentration in the vapor. It has been observed that high zinc surface concentration in gallium phosphide produces crystalline damage at the surface which propagates into the crystal. A reduction in the crystalline damage is observed when the zinc surface concentration is reduced. Below a surface concentration of $10^{20}$ zinc atoms per cubic centimeter no surface damage traceable to the presence of zinc has been observed. Such damage is detrimental to device performance. Another advantage of the reduction of zinc surface concentration lies in the reduction of free carrier absorption of light emitted at the electroluminescent junction. No observable improvement is realized until the charge is reduced to 90 percent of a saturating quantity. This limit is represented by curve 52.

As mentioned above, early workers in the field were plagued by problems of nonuniformity of zinc diffusion which produces irregular or nonplanar junctions. This problem has been solved to a great extent by previous workers through the use of phosphorus over pressure during zinc diffusion. Thus, if $ZnP_2$ is to be used as a zinc source, it is desirable that enough be used so as to produce a phosphorus partial pressure in the diffusion chamber which is greater than the equilibrium pressure of phosphorus over gallium phosphide at the diffusion temperature. Curve 53, derived from published information, represents the amount of zinc phosphide which, when evaporated, produces a phosphorus partial pressure just equal to the equilibrium pressure of phosphorus over gallium phosphide as a function of temperature. Below 900° C curve 53 falls to less than 0.01 micrograms per cubic centimeter of chamber volume. Such quantities are impractically small so that curve 56 represents the lower limit of the invention for temperatures below 900° C.

At 900° C measurements have shown that zinc surface concentrations between $2 \times 10^{18}$ and $10^{20}$ zinc atoms per cubic centimeter are realized through the use of $ZnP_2$ charges between 10 micrograms and 50 micrograms per cubic centimeter of capsule volume. This represents a range between approximately 8 percent and 40 percent of a saturating quantity of $ZnP_2$ at the diffusion temperature (900° C). This range of zinc surface concentration represents a preferred range for presently contemplated electroluminescent devices. Over the diffusion temperature range of 600° to 1,200° C these percentages represent a preferred range for operation of the invention. The upper and lower limits of this range are represented by curves 54 and 55.

The most widely used method for obtaining red light emission from GaP diodes involves the inclusion of oxygen as an additional impurity in the zinc doped region. For the diffused-junction device contemplated here, it is desirable that oxygen be included in the n-type wafer before zinc diffusion (oxygen diffuses very slowly in GaP). Those prior workers producing grown junction electroluminescent diodes have found that heat treatments subsequent to junction growth at temperatures lower than the growth temperature enhanced the red light output of their devices. It was similarly found, for devices produced by the disclosed process that heat treatments subsequent to diffusion at temperatures lower than the diffusion temperature enhance the red light output of diffused junction devices. It is observed that these heat treatments are most beneficial if performed in an essentially zinc-free atmosphere. The preferred heat treatment temperatures and times correspond generally to those found in the prior art. These temperatures lie about 400° C and the times are greater than two hours.

EXAMPLES

1. Red emitting diodes were produced in accordance with the invention by the following procedure: A tellurium and oxygen doped epitaxial layer was grown on a tellurium doped wafer of GaP cut from a Czochralski grown crystal. The layer was grown from a gallium solution saturated with GaP and doped with 0.02 mole percent $Ga_2O_3$ and 0.016 atomic percent tellurium. The 30 micrometer thick layer so produced had a donor concentration of $5 \times 10^{17}$ per cubic centimeter. This composite wafer was cleaned and placed in a diffusion capsule (prepared from a 15 cm long section of 10 millimeter I.D. fused quartz tube sealed at one end) together with several small crystals of $ZnP_2$ weighing a total of 134 micrograms. The tube was evacuated and sealed to form a capsule 3.31 cubic centimeters in volume. The 6 cm long capsule was cleaned and placed in a furnace with an 18 inch long uniform temperature zone (±0.3° C) and held there at 900° C for 16 hours. The capsule was removed from the oven with wet asbestos tongs which resulted in condensation of the zinc-phosphorus gasses on the inside of the capsule wall rather than on the wafer. The wafer was then removed, cleaned and placed in another evacuated capsule. The wafer was heat treated in this capsule for eight hours at 750° C. A second heat treatment was subsequently carried out in a hydrogen atmosphere for 16 hours at 525° C. This procedure produced a p-n junction in the epitaxial layer, approximately 13 micrometers below the surface. Standard fabrication procedures were used to produce eight diodes from the wafer. The efficiency of these diodes ranged from 1.1 to 1.5 percent red light output quantum efficiency at a current density of one ampere per square centimeter of junction area and from 0.8 to 0.9 percent red light output quantum efficiency at seven amperes per square centimeter of junction area.

2. A series of diffusions were carried out for several time intervals at 850° C and a zinc pressure of 0.022 atmospheres (or the results corrected to this pressure) in order to observe the variation of junction depth with time. The procedure was similar to the above and the results appear in Table 1.

TABLE I

Junction Depth as a Function of Time (850°C - Zinc Pressure 0.022 atmospheres)

| Time (Hours) | Depth (Micrometers) |
|---|---|
| 4 | 5 to 6 |
| 15 | 10 to 12 |
| 17 | 13 to 14 |
| 64 | 34 to 35 |

3. A series of diffusions was carried out for several different weights of $ZnP_2$ at 900° C for 16 hours by a procedure similar to Example (1). A representative selection of the resulting junction depths and efficiencies of red light output appear in Table II.

TABLE II

Variation of Junction Depth With $ZnP_2$ Weight

| Weight of $ZnP_2$ per $cm^3$ of capsule volume (micrograms) | Junction Depth (micrometers) | Electroluminescent Efficiency (percent) |
|---|---|---|
| 27 | 9 | 1.0 |
| 41 | 13 | 1.4 |
| 46 | 17 | 1.2 |
| 68 | 24 | 0.55 |

What is claimed is:

1. A method for the production of an electroluminescent semiconductor device comprising:

a. enclosing an n-type GaP body within a diffusion chamber together with a source of zinc; and b. heat treating the GaP body according to a heat treatment schedule which includes maintaining the chamber at an elevated diffusion temperature for a diffusion time where the diffusion temperature and the diffusion time are chosen such that a p-n junction is produced within the GaP body characterized in that the source of zinc consists essentially of $ZnP_2$ of such quantity as to be completely evaporated in the closed diffusion chamber at the diffusion temperature during at least a major portion of the diffusion time.

2. A method of claim 1 in which the source of zinc is included in the closed diffusion chamber in such quantity as to be not greater than 90 percent of a saturating quantity of $ZnP_2$ at the diffusion temperature and at least sufficient to establish a phosphorus pressure equal to the equilibrium pressure of phosphorus over GaP at the diffusion temperature and greater than 0.01 micrograms per cubic centimeter of chamber volume.

3. A method of claim 2 in which the diffusion time is between 15 minutes and 24 hours and the diffusion temperature is between 600° and 1,200° C.

4. A method of claim 3 in which the heat treatment schedule includes heat treating the GaP portion in an atmosphere essentially free of Zn at a heat treatment temperature greater than 400° C for a heat treatment time greater than 2 hours whereby the output of red light is enhanced.

5. A method of claim 2 in which the source of zinc is included in the closed diffusion chamber in such quantity as to be at least 8 percent and not greater than 40 percent of a saturating quantity of $ZnP_2$ at the diffusion temperature.

6. A method of claim 1 in which at least one area of the GaP body surface is masked so as to prevent diffusion of zinc into that area.

7. A device produced by the process of claim 1.

* * * * *